United States Patent
Willer

(10) Patent No.: US 6,507,499 B1
(45) Date of Patent: Jan. 14, 2003

(54) MICROPROCESSOR EMI SHIELD

(75) Inventor: Bernd Willer, Moorsburg (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,090

(22) Filed: May 2, 2001

(51) Int. Cl.$^7$ ............................................... H05K 9/00
(52) U.S. Cl. ........................ 361/816; 361/818; 361/800; 361/704; 361/709; 361/803; 361/790
(58) Field of Search ................................ 361/816, 818, 361/760, 761, 800, 803, 825, 735, 790, 791, 764, 785, 704, 709

(56) References Cited

U.S. PATENT DOCUMENTS 6,144,559 A * 11/2000 Johnson et al. ............. 361/760
6,243,265 B1 * 6/2001 Wong et al. ................ 361/704

* cited by examiner

*Primary Examiner*—Jayprakash N. Gandhi
*Assistant Examiner*—Thanh Y. Tran
(74) *Attorney, Agent, or Firm*—Leon R. Turkevich

(57) ABSTRACT

A microprocessor EMI shield is configured for isolating EMI emissions from the microprocessor, and grounding any electric potential caused by EMI emissions detected by the microprocessor heat sink. The microprocessor EMI shield includes a low-impedance conductive surface sufficient for conducting electric potential induced based on EMI emissions from the microprocessor. The microprocessor EMI shield also includes an array of apertures for accommodating the respective microprocessor pins. The array of apertures includes a first group of apertures for accommodating the microprocessor non-ground pins, each having a spaced diameter for avoiding contact with the corresponding non-ground microprocessor pin, and a second group of apertures for accommodating the microprocessor ground pins. The second group of apertures each have a contact member configured for electrically connecting the corresponding ground pin to the low-impedance conductive surface, establishing a ground potential on the low-impedance conductive surface upon connection of the microprocessor pins with respective socket connectors. The low-impedance conductive surface also has an edge portion configured for engaging the microprocessor heat sink overlying the microprocessor, forming an enclosure for enclosing the microprocessor. The enclosure formed by the conductive heat sink surface and the microprocessor EMI shield provides a grounded shield to isolate EMI emissions from the microprocessor.

9 Claims, 3 Drawing Sheets

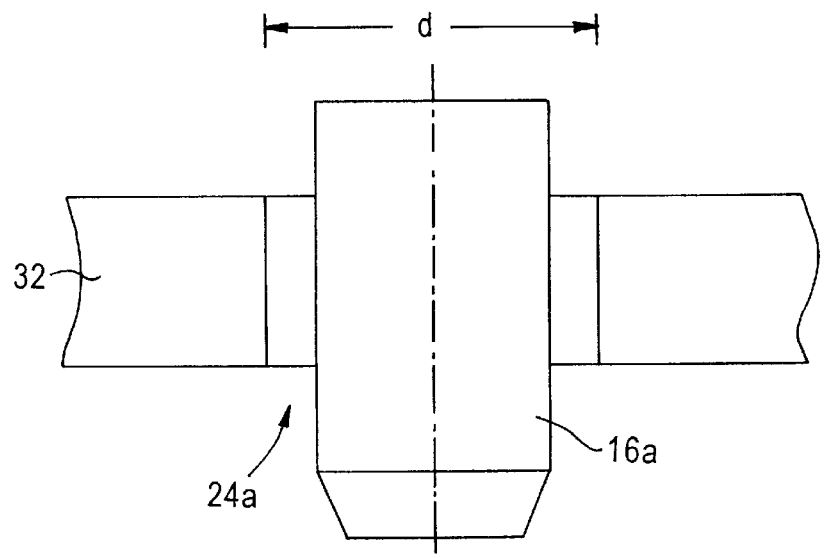
FIG. 3A
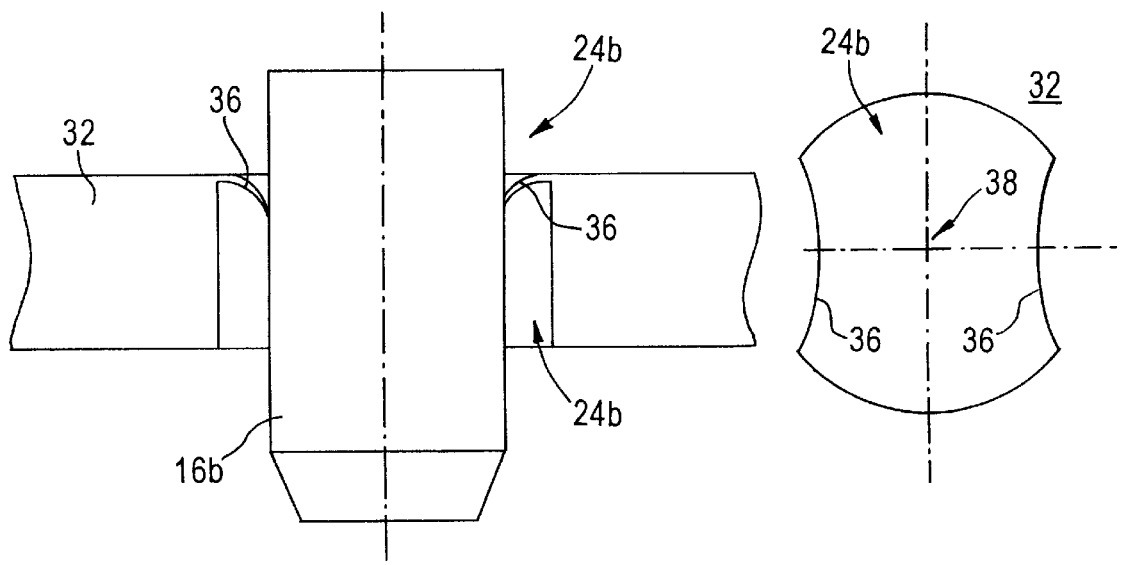
FIG. 3B
FIG. 3C

MICROPROCESSOR EMI SHIELD

BACKGROUND OF THE INVENTION

1. Field of the Invention

The present invention relates to minimizing electromagnetic interference (EMI) radiated from high-speed microprocessors operating at clock speeds at or exceeding 1 GHz.

2. Background Art

Europe requires electronic devices, such as microprocessor based systems, to comply with a European norm standard (EN-55022) that limits the amount of radiated EMI noise that can be radiated from the electronic device. The standard EN-55022 specifies different limits (on the order of $dB\mu V$) based on the respective frequency bands. In particular, the standard EN-55022 specifies that devices operating at frequencies at about 1 GHz have a substantially stricter (i.e., lower) limit of radiated EMI noise than devices operating at frequencies substantially below 1 GHz. Hence, newer microprocessors operating at or above 1 GHz clock rates are more likely to fail the stricter radiated EMI limits specified by the standard EN-55022 due to the higher processor clock rates and harmonics radiated from the microprocessor buses.

A particular problem with EMI emissions in higher speed microprocessors involves the positioning of heat sinks overlying the microprocessor. The positioning of the heat sink directly above a microprocessor results in galvanic or capacitive coupling of the high frequency noise radiating from the microprocessor into the heat sink. Hence, the heat sink may effectively serve as an antenna for certain high frequency noise harmonics radiating from the microprocessor. In addition, the EMI emissions from the microprocessor may be capacitively coupled to cables in proximity to the microprocessor and the heat sink. Hence, EMI emissions may be radiated from the heat sink, and cables with the computer, especially from unshielded power cables. Consequently, if a computer fails the EN-55022 compliance tests, then it cannot obtain the CE approval necessary to market the computer in Europe.

SUMMARY OF THE INVENTION

There is a need for an arrangement that provides sufficient shielding of EMI emissions from higher speed microprocessor clocks to ensure compliance with prescribed EMI emissions standards.

There also is a need for an arrangement that shields EMI emissions from higher speed microprocessor clocks without modification of existing microprocessor socket designs, and that can be manufactured as a low-cost part using mass production.

There also is a need for an arrangement that shields EMI emissions from higher speed microprocessor clocks and provides a ground to minimize EMI emissions by the microprocessor heat sink.

These and other needs are attained by the present invention, where a microprocessor EMI shield is configured for isolating EMI emissions from the microprocessor, and grounding any electric potential caused by EMI emissions detected by the microprocessor heat sink. The microprocessor EMI shield includes a low-impedance conductive surface sufficient for conducting electric potential induced based on EMI emissions from the microprocessor. The microprocessor EMI shield also includes an array of apertures for accommodating the respective microprocessor pins, including microprocessor ground pins and microprocessor non-ground pins. The array of apertures includes a first group of apertures for accommodating the microprocessor non-ground pins, each having a spaced diameter for avoiding contact with the corresponding non-ground microprocessor pin, and a second group of apertures for accommodating the microprocessor ground pins. The second group of apertures each have a contact member configured for electrically connecting the corresponding ground pin to the low-impedance conductive surface, establishing a ground potential on the low-impedance conductive surface upon connection of the microprocessor pins with respective socket connectors. The low-impedance conductive surface also has an edge portion configured for engaging the microprocessor heat sink overlying the microprocessor, forming an enclosure for enclosing the microprocessor. Since the microprocessor heat sink also includes a conductive surface, the enclosure formed by the microprocessor heat sink and the microprocessor EMI shield provides a grounded shield to isolate EMI emissions from the microprocessor.

One aspect of the present invention provides a method of shielding a microprocessor. The method includes positioning a shield between a microprocessor, having microprocessor pins including ground pins and non-ground pins, and a microprocessor socket having socket connectors configured for receiving the respective microprocessor pins. The shield includes a low-impedance conductive surface sufficient for conducting electric potential induced based on EMI emissions from the microprocessor. The shield also includes an array of apertures including a first group of apertures configured for accommodating the respective non-ground pins and having a prescribed diameter for avoiding contact thereof, and a second group of apertures. The second group of apertures are configured for accommodating the respective ground pins and each having a contact member configured for electrically connecting the corresponding ground pin to the low-impedance conductive surface. The shield also includes an edge portion on the low-impedance conductive surface configured for engaging a microprocessor heat sink overlying the processor. The microprocessor pins are inserted through the array of apertures and into the microprocessor socket connectors, and the microprocessor heat sink is engaged with the edge portion to enclose the microprocessor. Hence, the microprocessor is enclosed between the shield and the microprocessor heat sink, enabling EMI emissions from the microprocessor to be isolated by the grounded shield and the ground microprocessor heat sink.

Another aspect of the present invention provides a shield configured for enclosing a microprocessor having microprocessor pins including ground pins and non-ground pins. The shield includes a low-impedance conductive surface sufficient for conducting electric potential induced based on EMI emissions from the microprocessor. The shield also includes an array of apertures including a first group of apertures configured for accommodating the respective non-ground pins and having a prescribed diameter for avoiding contact thereof, and a second group of apertures configured for accommodating the respective ground pins and each having a contact member configured for electrically connecting the corresponding ground pin to the low-impedance conductive surface. The shield also includes an edge portion on the low-impedance conductive surface configured for engaging a microprocessor heat sink overlying the processor. Hence EMI emissions from the microprocessor can be shielded by enclosing the microprocessor between the shield and the microprocessor heat sink, and inserting the microprocessor pins through the array of apertures into the microprocessor socket connectors, forming a grounded enclosure for the microprocessor.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein:

FIGS. 3A, 3B, and 3C are diagrams illustrating apertures used within the shield of FIG. 1 for microprocessor non-ground pins and ground pins.

BEST MODE FOR CARRYING OUT THE INVENTION

Figure 1:
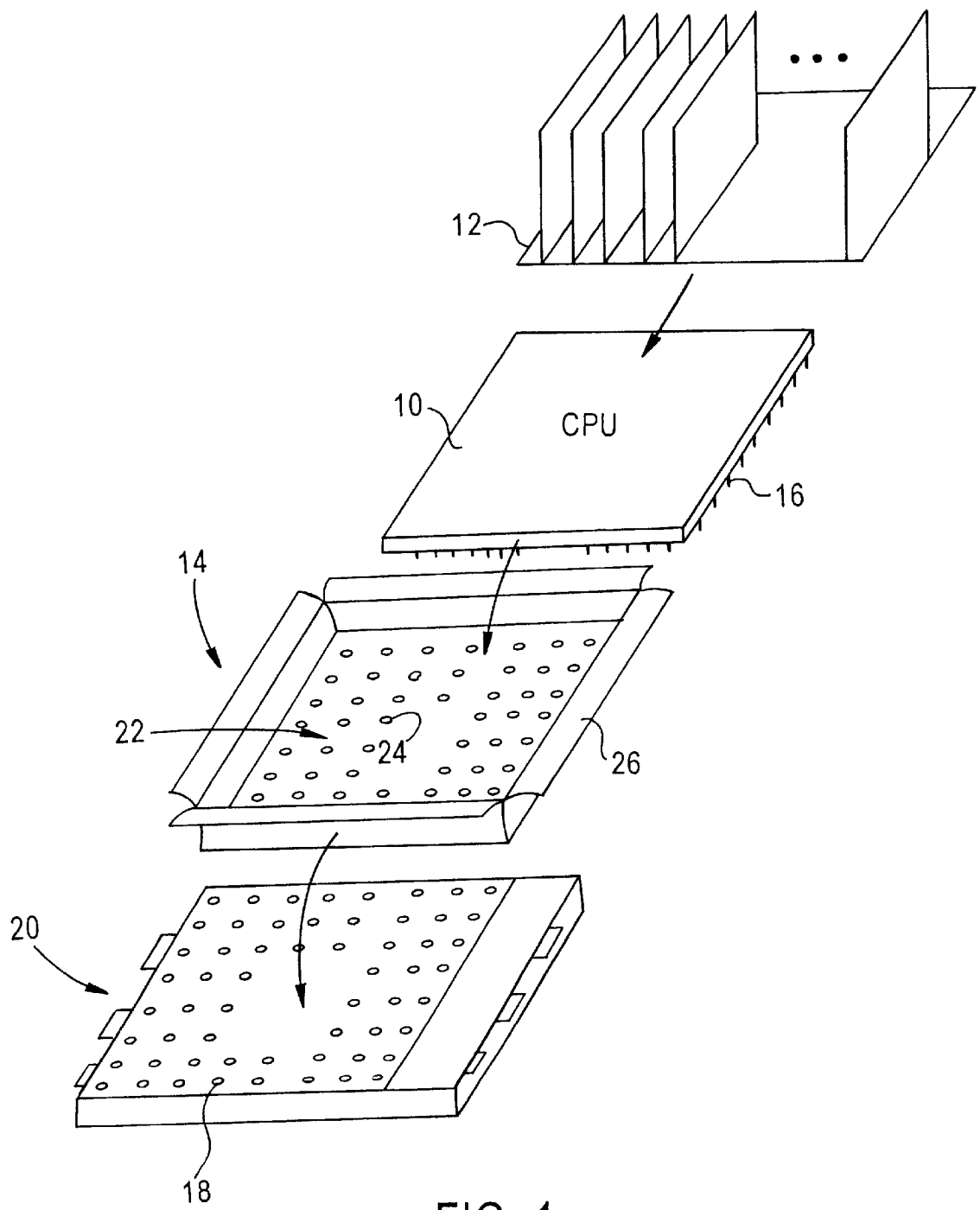
FIG. 1 is a diagram illustrating a perspective view of an EMI shield for use in isolating EMI emissions from a microprocessor, according to an embodiment of the present invention.

FIG. 1 is a diagram illustrating a method of shielding a microprocessor (i.e., a central processing unit (CPU)) 10 by enclosing within a heat sink 12 and an EMI shield 14, according to an embodiment of the present invention. Conventionally the microprocessor pins 16 of the CPU 10 have been inserted into respective microprocessor socket connectors 18 of a microprocessor socket 20, and the heat sink 12 attached overlying the CPU 12, resulting in radiation of EMI emissions from the microprocessor.

According to the disclosed embodiment, the EMI shield 14 is positioned between the microprocessor 10 and the microprocessor socket 20, and includes an array 22 of apertures 24 configured for accommodating the microprocessor pins 16, described in detail below with reference to FIG. 2 and FIGS. 3A, 3B, and 3C. The array 22 enables the microprocessor pins 16 to pass through the shield 14 for connection to the microprocessor socket 20. In addition, the EMI shield 14 includes a curved edge portion 26 configured for engaging the microprocessor heat sink 12 as the microprocessor heat sink 12 is installed overlying the processor 10, enabling the formation of an enclosure 30, illustrated in FIG. 2.

Figure 2:
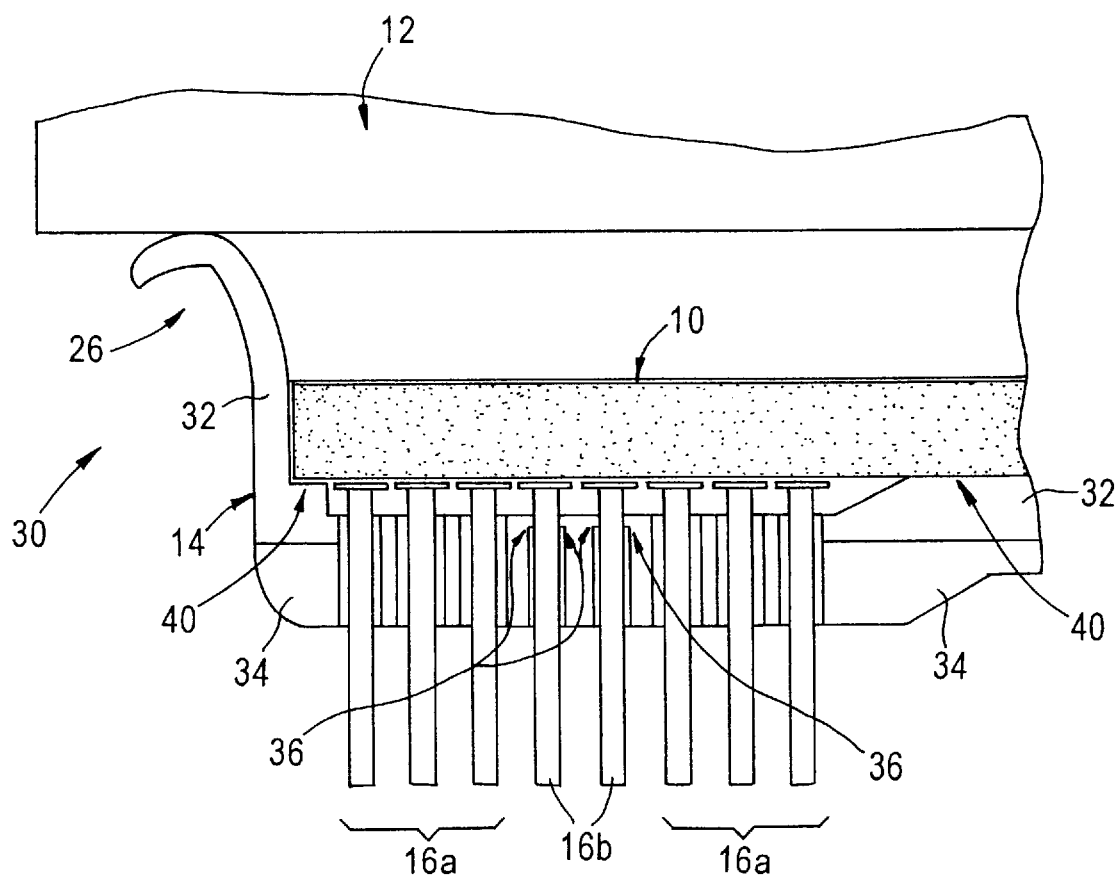
FIG. 2 is a diagram illustrating a grounded enclosure formed by insertion of an EMI shield between the microprocessor and a microprocessor socket, and engagement of the EMI shield with a microprocessor heat sink, according to an embodiment of the present invention.

FIG. 2 is a cross-sectional view of the enclosure 30 formed by the EMI shield 14 during engagement of the edge portion 26 with the heat sink 12. As illustrated in FIG. 2, the EMI shield 14 includes a low-impedance conductive surface 32, for example copper, and a nonconductive material (e.g., ceramic, plastic, etc.) 34 underlying the low-impedance conductive surface 32. Alternately, the EMI shield 14 and the low-impedance conductive surface 32 may be integrally formed from copper sheet metal. In either case, the low-impedance conductive surface 32 has a sufficient minimal impedance for conducting electric potential induced by EMI emissions from the microprocessor 10. As illustrated in FIG. 2, the edge portion 26 on the conductive surface 32 expands outwardly to enable compression of the EMI shield 14 as the heat sink 12 is pressed toward the CPU 10 for fill engagement thereof. Note that full engagement between the CPU 10 and the heat sink 12 occurs upon the heat sink 12 contacting the die surface of the CPU 10 (i.e., no air gap between the heat sink 12 and the die surface) in order to maintain proper heat conduction. Hence, the EMI shield 14 also improves heat conduction by increasing the effective area of the heat sink 12.

As illustrated in FIG. 2, the CPU 10 includes non-ground pins (e.g., Vcc, data, clock, control, address, etc.) 16a and ground pins (i.e., Vss) 16b. The array 22 includes a first group of apertures 24a for accommodating the non-ground pins 16a, and a second group of apertures 24b for accommodating the ground pins 16b. The EMI shield 14 also includes an elevated surface 40 configured for engaging a lower surface of the microprocessor 10 in order to separate the ends of the microprocessor pins 16 from the low-impedance conductive surface 32.

FIG. 3A is a cross-sectional view illustrating in detail one of the first group of apertures 24a. The first group of apertures 24a each has a prescribed diameter "d" sufficient for avoiding contact with the corresponding non-ground pin 16a, avoiding a short-circuit between the non-ground pin 16a and the low-impedance conductive surface 32.

FIGS. 3B and 3C are cross-sectional and top-level views of one of the second group of apertures 24b configured for establishing electrical contact with the corresponding ground pin 16b. FIG. 3C illustrates one of the second group of apertures 24 on the low-impedance conductive surface 34 without insertion of the ground pin 16b, where the contact member 36 projects inwardly toward the aperture center 38. As illustrated in FIG. 3B, insertion of the ground pin 16b into the aperture 24b causes engagement of the ground pin 16b with the contact member 36, establishing an electrical connection between the ground pin 16b and the low-impedance conductive surface 32.

Hence the ground pins 16b, which establish a ground connection for the CPU 10 upon connection with the microprocessor socket 20, also provide a ground connection for the EMI shield 14 and the heat sink 12 based on electrical contact with contact members 36. Hence, any EMI emissions from the microprocessor 10 are absorbed by the low-impedance conductive surface 32 and the conductive surface of the heat sink 12, enabling any induced electric potential to be conducted to the ground pins 16b.

According to the disclosed embodiment, an EMI shield enables EMI emissions from the microprocessor to be shielded based on electrical connections to microprocessor ground pins. In addition, any EMI emissions detected by the heat sink 12 are conducted by the conductive surface of the EMI shield to the microprocessor ground pins. Hence, EMI emissions from microprocessors operating at substantially high clock rates, such as 1 GHz or above, can be shielded to enable computers operating such high-speed microprocessors to comply with EMI emissions standards, such as EN-55022.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method of shielding a microprocessor, the method comprising:

positioning a shield between a microprocessor, having microprocessor pins including ground pins and non-ground pins, and a microprocessor socket having socket connectors configured for receiving the respective microprocessor pins, the shield including:

(1) a low-impedance conductive surface sufficient for conducting electric potential induced based on EMI emissions from the microprocessor, (2) an array of apertures including a first group of apertures configured for accommodating the respective non-ground pins and having a prescribed diameter for avoiding contact thereof, and a second group of apertures configured for accommodating the respective ground pins and each having a contact member configured for electrically connecting the corresponding ground pin to the low-impedance conductive surface, and (3) an edge portion on the low-impedance conductive surface configured for engaging a microprocessor heat sink overlying the processor;

inserting the microprocessor pins through the array of apertures and into the microprocessor socket connectors; and engaging the microprocessor heat sink with the edge portion to enclose the microprocessor.

2. The method of claim 1, wherein the shield further includes a nonconductive material underlying the low-impedance conductive surface.

3. The method of claim 1, wherein the edge portion includes outwardly curving edges, relative to a center of the shield, enabling compression of the shield upon engagement with the microprocessor heat sink.

4. The method of claim 1, wherein the shield further includes an elevated surface configured for engaging a lower surface to the microprocessor and separating ends of the microprocessor pins from the low-impedance conductive surface.

5. A shield configured for enclosing a microprocessor having microprocessor pins including ground pins and non-ground pins, the shield including:

a low-impedance conductive surface sufficient for conducting electric potential induced based on EMI emissions from the microprocessor;

an array of apertures including a first group of apertures configured for accommodating the respective non-ground pins and having a prescribed diameter for avoiding contact thereof, and a second group of apertures for accommodating the respective ground pins and each having a contact member configured for electrically connecting the corresponding ground pin to the low-impedance conductive surface; and an edge portion on the low-impedance conductive surface configured for engaging a microprocessor heat sink overlying the processor.

6. The shield of claim 5, wherein the shield further includes a nonconductive material underlying the low-impedance conductive surface.

7. The shield of claim 5, wherein the shield and the surface formed integrally thereon are formed from a low-impedance conductive material.

8. The shield of claim 5, wherein the edge portion includes outwardly curving edges, relative to a center of the shield, enabling compression of the shield upon engagement with the microprocessor heat sink.

9. The shield of claim 5, wherein the shield further includes an elevated surface configured for engaging a lower surface to the microprocessor and separating ends of the microprocessor pins from the low-impedance conductive surface.

* * * * *